United States Patent
Ayranci et al.

(10) Patent No.: US 9,973,149 B2
(45) Date of Patent: May 15, 2018

(54) SOURCE SWITCHED SPLIT LNA

(71) Applicant: pSemi Corporation, San Diego, CA (US)

(72) Inventors: Emre Ayranci, Costa Mesa, CA (US); Miles Sanner, San Diego, CA (US)

(73) Assignee: pSemi Corporation, San Diego, CA (US)

( * ) Notice: Subject to any disclaimer, the term of this patent is extended or adjusted under 35 U.S.C. 154(b) by 0 days. days.

(21) Appl. No.: 15/342,016

(22) Filed: Nov. 2, 2016

(65) Prior Publication Data

US 2018/0019710 A1    Jan. 18, 2018

Related U.S. Application Data

(60) Provisional application No. 62/363,120, filed on Jul. 15, 2016.

(51) Int. Cl.
*H03F 1/14* (2006.01)
*H03F 1/02* (2006.01)
*H03F 3/193* (2006.01)
*H03F 1/56* (2006.01)

(52) U.S. Cl.
CPC ........... *H03F 1/0277* (2013.01); *H03F 1/565* (2013.01); *H03F 3/193* (2013.01); *H03F 2200/294* (2013.01); *H03F 2200/387* (2013.01); *H03F 2200/411* (2013.01)

(58) Field of Classification Search
CPC ............... H03F 3/193; H03F 3/68; H03F 1/14
USPC .................................. 330/51, 283, 301, 126
See application file for complete search history.

(56) References Cited

U.S. PATENT DOCUMENTS

| | | | |
|---|---|---|---|
| 6,804,502 B2 | 10/2004 | Burgener et al. | |
| 7,910,993 B2 | 3/2011 | Brindle et al. | |
| 9,077,290 B2 | 7/2015 | Din et al. | |
| 9,407,215 B2 | 8/2016 | Gill | |
| 2008/0231366 A1* | 9/2008 | Roufoogaran | H03F 3/211 330/261 |

(Continued)

FOREIGN PATENT DOCUMENTS

WO    2018013206    1/2018

OTHER PUBLICATIONS

Denini, Monica, International Search Report and Written Opinion received from the EPO dated Aug. 4, 2017 for appln. No. PCT/US2017/032157, 18 pgs.

(Continued)

*Primary Examiner* — Steven J Mottola
(74) *Attorney, Agent, or Firm* — Jaquez Land Greenhaus LLP; Martin J. Jaquez, Esq.; Bruce W. Greenhaus, Esq.

(57) ABSTRACT

A receiver front end capable of receiving and processing intraband non-contiguous carrier aggregate (CA) signals using multiple low noise amplifiers (LNAs) is disclosed herein. A cascode having a "common source" configured input FET and a "common gate" configured output FET can be turned on or off using the gate of the output FET. A first switch is provided that allows a connection to be either established or broken between the source terminal of the input FET of each LNA. Further switches used for switching degeneration inductors, gate capacitors and gate to ground caps for each legs can be used to further improve the matching performance of the invention.

33 Claims, 9 Drawing Sheets

(56) References Cited

U.S. PATENT DOCUMENTS

2010/0164498 A1* 7/2010 Helvoort .................. H03F 3/68
324/322
2010/0321113 A1 12/2010 Kathiresan et al.
2013/0316671 A1 11/2013 Stockinger et al.
2014/0240048 A1 8/2014 Youssef et al.
2016/0065264 A1 3/2016 Wu et al.

OTHER PUBLICATIONS

Zhang, et al., "Linearization Techniques for CMOS Low Noise Amplifiers: A Tutorial", IEEE Transactions on Circuits and Systems-I: Regular Papers, vol. 58, No. 1, Jan. 2011, pp. 22-36.

* cited by examiner

SOURCE SWITCHED SPLIT LNA

CROSS REFERENCE TO RELATED APPLICATIONS

The present application claims priority to U.S. provisional Patent Application Ser. No. 62/363,120, filed on Jul. 15, 2016, for a "Source Switched Split LNA", which is herein incorporated by reference in its entirety.

BACKGROUND

(1) Technical Field

Various embodiments described herein relate to amplifiers and more particularly to Low noise amplifiers for use in communications equipment.

(2) Background

The front end of a communications receiver typically includes a low noise amplifier ("LNA") that is responsible for providing the first stage amplification to a signal received within the communications receiver. The operational specifications of the LNA are very important to the overall quality of the communications receiver. Any noise or distortion in the input to the LNA will get amplified and cause degradation of the overall receiver performance. Accordingly, the sensitivity of a receiver is, in large part, determined by the quality of the front end and in particular, by the quality of the LNA.

In some cases, the LNA is required to operate over a relatively broad frequency band and to amplify signals having several modulated baseband or intermediate frequency (IF) signals. One example of a situation in which the LNA is required to amplify a received signal having multiple modulated IF or baseband signals is the case in which an intraband noncontiguous carrier aggregation (CA) signal is to be received. A CA signal can have two channels (or IF carriers) having frequencies that are not adjacent to one another, but which lie in the same frequency band. For example, a CA signal may have two non-adjacent channels within a cellular frequency band defined by 3rd Generation Partnership Project (3GPP), a well-known industry standard setting organization.

In the case in which a receiver is required to receive a CA signal, such as a cellular telephone that is compliant with the Release 11 of the 3GPP communications industry standard, the LNA typically amplifies the received signal and provides the amplified output signal to a passive splitter. FIG. 1 is an illustration of a portion of a cellular telephone front end in which an LNA 101 is coupled to a variable attenuator 103. A bypass switch 105 allows the variable attenuator to be optionally shunted. The signal is then coupled to a single pole, three throw mode selector switch 107 that allows the output of the LNA 101 to be selectively coupled to only a first downconverter and baseband circuitry (DBC) 109, a second DBC 111 or both the first and the second DBC 109, 111.

When the mode selector switch 107 is in the first position (i.e., Single Channel mode 1), the output of the LNA 101 is coupled directly to the first DBC 109. In the second position (i.e., Split mode), the output of the LNA 101 is coupled through a passive power splitter 113 to both the first and second DBC 109, 111. In the third position (i.e., Single Channel mode 2), the output of the LNA 101 is coupled to only the second DBC 111.

There are several limitations that arise from the architecture shown in FIG. 1. The first limitation is the amount of isolation that can be achieved between the first and second DBC 109, 111. Typically, a well-manufactured 3 dB splitter can achieve approximately 18-20 dB of isolation between outputs at the center frequency for which the splitter 113 is designed to operate. Signals that are cross-coupled from one DBC to the other will typically result in interference and distortion that will result in an overall reduction in sensitivity of the receiver.

Furthermore, passive splitters typically are designed to operate optimally in a relatively narrow frequency range. That is, passive splitters, by their nature are narrow band devices. As the frequency of the signal coupled through the splitter 113 deviates from the optimal frequency for which the splitter was designed, the output-to-output isolation will degrade. Due to the limitations of the splitters currently available, and because receivers that are designed to handle CA signals must operate in a relatively broad frequency range, the desired isolation between the DBCs 109, 111 is difficult to achieve.

Furthermore, power splitters such as the splitter 113 shown in FIG. 1, have significant loss. Since 3 dB power splitters split the power in half, even an ideal splitter will result in a 3 dB reduction in power. In addition, most splitters will have an additional 1.0 to 1.5 dB of insertion loss. The insertion loss, like the output-to-output isolation, will typically get worse as the frequency of the signals applied deviates from the center frequency for which the splitter was designed to operate.

Still further, the losses encountered in the mode selection switch 107 and the splitter 113 lead to a need for more gain. This results in reductions in linearity (as typically characterized by measuring the "third order intercept") and degradation of the noise figure of the receiver when operating in Split mode.

Therefore, there is a currently a need for a CA capable receiver front end that can operate in Split mode with high output-to-output isolation, without degraded third order intercept and noise figure, and with relatively low front end losses.

SUMMARY OF THE INVENTION

A receiver front end capable of receiving and processing intraband non-contiguous carrier aggregate (CA) signals using multiple low noise amplifiers (LNAs) is disclosed herein. In accordance with some embodiments of the disclosed method and apparatus, each of a plurality of amplifiers is an LNA configured as a cascode (i.e., a two-stage amplifier having two transistors, the first configured as a "common source" input transistor, e.g., input field effect transistor (FET), and the second configured in a "common gate" configuration as an output transistor, (e.g. output FET). In other embodiments, the LNA may have additional transistors (i.e., more than two stages and/or stacked transistors). Each LNA can be turned on or off using the gate of the output FET. The gates of an input FET are coupled together to form a common input. However, in some embodiments, the gates of the two FETs can be separated to allow the gate of an input FET of an LNA that is off to be independently controlled to turn off the input FET. A first switch is provided that allows a connection to be either established or broken between the source terminal of the input FET of each LNA. In addition, a second switch allows a switchable gate-to-source and/or gate to ground capacitor to be selectively applied to the input FET of at least one of the LNAs. In some embodiments, an additional switch is provided that allows a source to ground degeneration inductor to be disconnected from the source terminal of an input FET of an LNA that is turned off. Selectively turning the LNAs on and off allows the amplifier to operate in both a single mode and a split mode. Furthermore, use of the switches ensures that the input impedance to the amplifier is the same in single mode and in split mode.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION OF THE INVENTION

Figure 2:
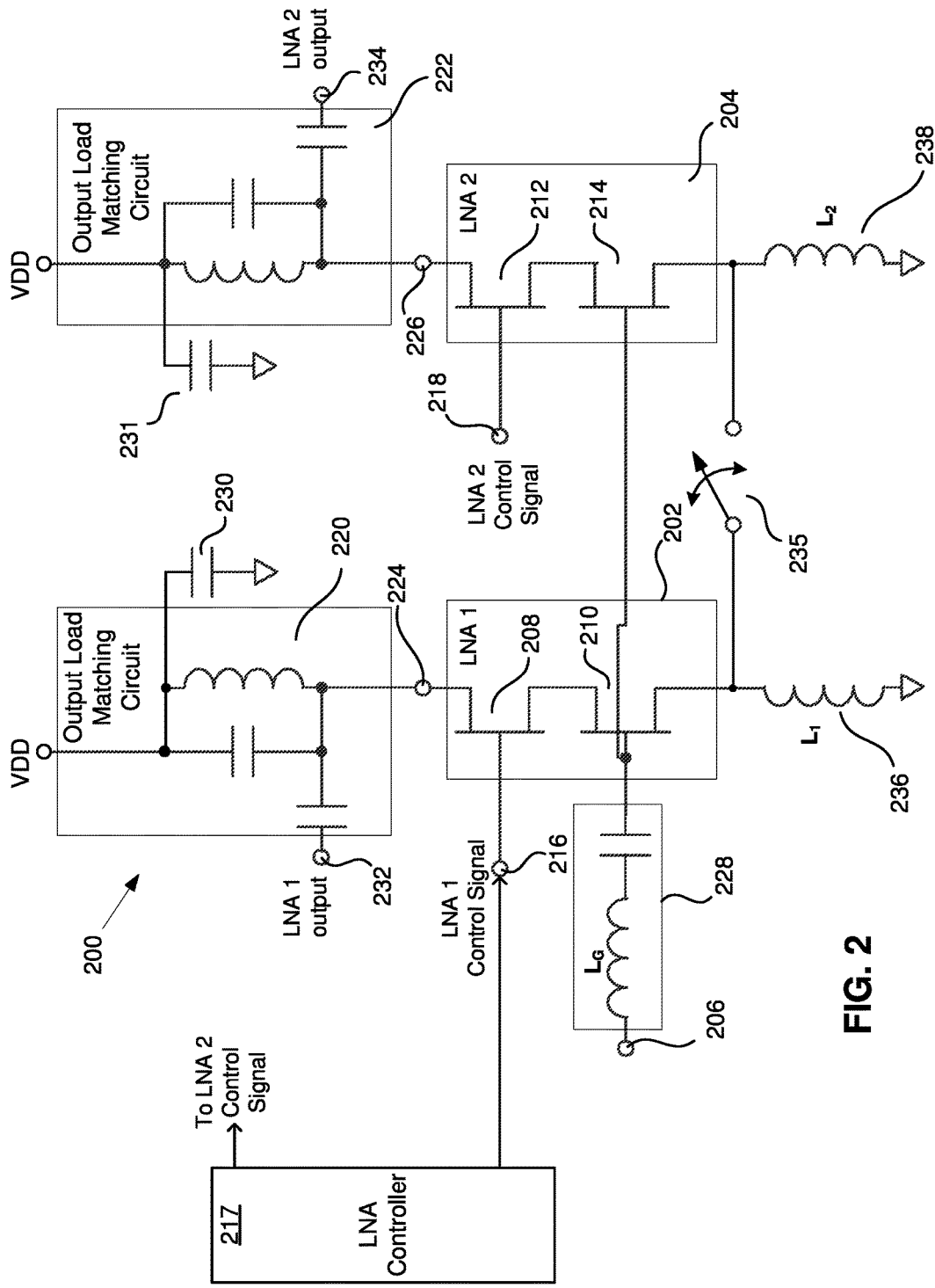
FIG. 2 is an illustration of a front end amplifier that uses multiple LNAs operating in either single mode or split mode.

FIG. 2 is an illustration of a front end amplifier 200 of a communications receiver in which multiple low noise amplifiers (LNAs) 202, 204 are used to amplify signals. Signals to be amplified are coupled through a front end signal input terminal 206. In a first mode, referred to as "single mode", one of the LNAs 202, 204 is turned on (i.e., is actively amplifying a signal applied to the input of the LNA 202, 204). The amplified output of the active LNA 202, 204 is coupled to an output terminal 232, 234. The other LNA 204, 202 is turned off (i.e., not actively amplifying the signal applied to the input of the LNA 204, 202). In one embodiment of the disclosed method and apparatus, each LNA 202, 204 comprises a pair of field effect transistors (FETs) 208, 210, and 212, 214. Each pair forms a two-stage LNA in a cascode architecture. However, it will be understood by those skilled in the art that other types of transistors may be used, including, but not limited to, bipolar junction transistors. Furthermore, any type of FET may be used to implement the LNA, including, but not limited to metal-oxide semiconductors (MOSFETs), junction field effect transistors (JFETs), insulated gate FETs (IGFETs), metal semiconductor FETs (MESFETs), etc. While some types of transistors may be better suited to particular applications, the concepts associated with the disclosed method and apparatus do not exclude the use of any particular type of transistor. Still further, additional transistors can be included within an LNA either as additional amplifier stages or stacked with those FETs 208, 212 that are shown.

LNA control signals applied to control input terminals 216, 218 coupled to the gates of the output transistors (e.g., FETs) of the LNA implemented by the FETs 208, 212 control whether each LNA 202, 204 is on or off (i.e., amplifying or not amplifying). In one embodiment, the LNA control signals are generated by a control module, such as an LNA Controller 217. The LNA Controller 217 may generate the LNA control signals based on information regarding the types of signals that will be received by the amplifier 200, the content carried by the signals, or based on user commands to select one or more channels. The LNA controller 217 may be a general purpose processor capable of receiving commands and processing the commands to generate control signals to the LNAs and associated switches disclosed throughout this disclosure. Alternatively, the LNA controller 217 is a dedicated processor specially designed for generating the control signals. Those skilled in the art will understand how to make such a processor for receiving a command to enter a first mode, such as split mode, and determine the particular configuration of switches and LNA control signals to be generated. In some cases, the LNA controller 217 may be as simple as a logic block with look-up table. Alternatively, in some embodiments, the LNA controller 217 may also rely upon additional information in determining the states of switch control and LNA control signals.

In single mode, the LNA control signal to one of the LNAs 202, 204 causes that LNA to be turned on. The LNA control to the other LNA 204, 202 causes that LNA to be turned off. In split mode, both LNAs 202, 204 are on. It will be understood by those skilled in the art that additional LNAs not shown in FIG. 2 could be coupled similarly to extend the amplifier to select additional channels using additional modes of operation.

Output load matching circuits 220, 222 coupled to the output ports 224, 226 of each LNA 202, 204 provide a means by which the output impedance can be matched to a load. In one case, an input matching circuit 228 is provided to match the input impedance of the amplifier to the source. The input matching circuit 228 includes an input matching inductor with an inductance of $L_G$ and an input DC block capacitor $C_i$. An output shunt capacitors 230, 231 provide a relatively low capacitive reactance to a ground reference for signals in the frequency range of the input signals applied to the input of the LNAs 202, 204. In some embodiments, separate VDD supply voltage sources can be provided for each LNA in order to increase the isolation between the LNAs 202, 204. In other embodiments, the same source can be used to provide VDD to two or more of the LNAs.

Figure 1:
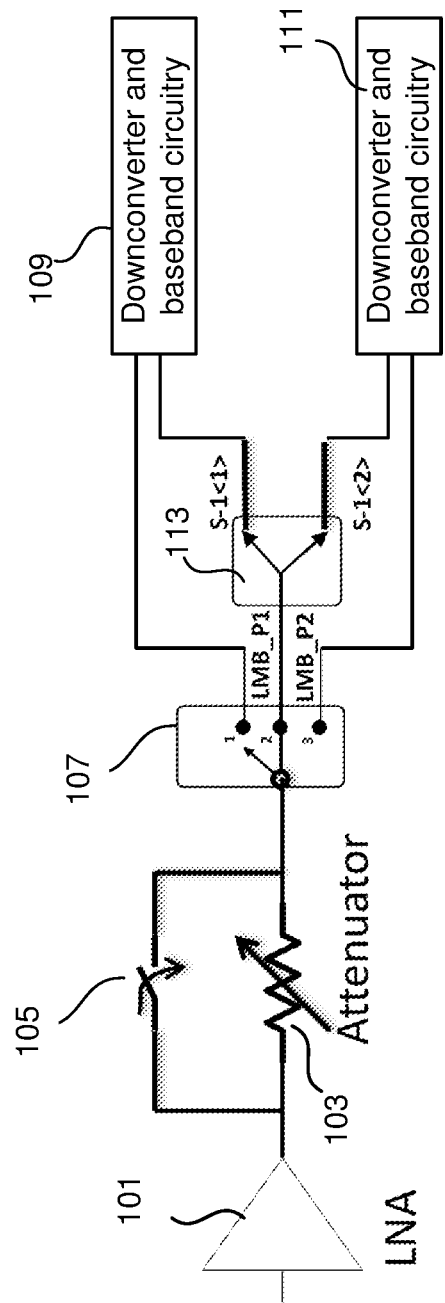
FIG. 1 is an illustration of a front end amplifier of a prior art communications receiver.

The front end 200 shown in FIG. 2 has an advantage over the prior art front end in that the amplifier 200 does not require a power splitter. Therefore, the loss experienced in the prior art circuit shown in FIG. 1 due to the power splitter 113 is eliminated in the circuit shown in FIG. 2. In addition, the isolation between the first LNA output 232 and the second LNA output 234 is significantly better than the isolation provided in the prior art front end using the power splitter 113. This is because the isolation between the outputs of the prior art front end is only as good as the isolation between the output ports of the power splitter 113.

In contrast, the isolation achieved by the front end 200 shown in FIG. 2 is enhanced by the fact that there is significant isolation between the output port 232 of the first LNA 202 and output port 234 of the second LNA 204. Furthermore, the isolation provided by the prior art splitter 113 will degrade as the frequency of one or both of the two channels being amplified deviates from the center frequency at which the splitter was designed to operate. Since the splitter may need to operate over a relatively broad frequency range in order to accommodate received CA signals, it will typically be designed to operate optimally at the center frequency of the frequency band of the CA signal to be received. Accordingly, when the channels of a CA signal are separated by several other channels, there will be less isolation between the outputs of the splitter. In contrast, in the amplifier 200, the isolation between the outputs of the front end will improve for signals that are separated by several intervening channels. That is, as the separation in frequency increases, the level of gain-versus-frequency overlap of one narrow band-tuned output to the other will decrease. This decrease will enhance the isolation between the outputs. In lower gain modes of operation, the output isolation will improve.

However, a significant problem needs to be addressed when using two LNAs in this manner. The input impedance of the front end amplifier 200 will vary depending upon the mode in which the receiver is operated. That is, the input impedance presented in single mode will be significantly different from the impedance presented in split mode largely due to a difference in gate-to-source capacitance, Cgs, of the FET transistor when the LNA is on and when the LNA is off. The reduction in the difference in input impedance that is attained by using the source switching split (SSS) LNA configuration can be seen in Table I, below. Table I shows that without SSS LNA, both the Real and Imaginary components of the input impedance, Zin, vary widely between the mode in which only the FET of LNA1 is ON and the mode in which the FETs of both LNA 1 and LNA 2 are ON. Table 1 further shows that a good input match is provided in split mode. Accordingly, the large input mismatch is eliminated by use of the SSS LNA configuration, resulting in a single mode input impedance that is the same as the input impedance presented in split mode.

This large difference in input impedances will cause a large input mismatch, which in turn creates large detrimental effects on virtually every aspect of the amplifier 200 and therefore, on the entire receiver of which the amplifier 200 is a part. The affect can be an increase in noise figure, a reduction in gain, and a degradation in linearity as, for example, measured by third order intercept (IP3).

|  | w/o SSS | | w/Source Switching (Split) | | |
| --- | --- | --- | --- | --- | --- |
|  | LNA1 | LNA1 + 2 | LNA1 | LNA1 + 2 | |
| Cgs1_sat | 0.2 | 0.4 | 0.2 | 0.4 | pF |
| Cgs1_off | 0.15 | 0 | 0.15 | 0 | pF |
| Cadd | 0 | 0 | 0.05 | 0 | pF |
| Cp | 0.2 | 0.2 | 0.2 | 0.2 | pF |
| Cgs1' | 0.2 | 0.4 | 0.4 | 0.4 | |
| Cp' | 0.35 | 0.2 | 0.2 | 0.2 | |
| Ls_gnd | 2 | 2 | 2 | 2 | nH |
| Linput | 19 | 19 | 19 | 19 | nH |
| Freq | 2 | 2 | 2 | 2 | GHz |
| FT | 10 | 10 | 10 | 10 | GHz |
| Term_1 | 131.9 | 131.9 | 131.9 | 131.9 | jOhm |
| Term_2 | 144.7 | 132.6 | 132.6 | 132.6 | -jOhm |
| Term_3 | 16.6 | 55.9 | 55.9 | 55.9 | |

-continued

|  | w/o SSS | | w/Source Switching (Split) | | |
| --- | --- | --- | --- | --- | --- |
|  | LNA1 | LNA1 + 2 | LNA1 | LNA1 + 2 | |
| Total Zin_Imag | 12.739 | 0.682 | 0.682 | 0.682 | jOhm |
| Total Zin_Real | 16.617 | 55.851 | 55.851 | 55.851 | Ohm |

$$Z_{in} = j\omega(L_G + L_1) + \frac{1}{j\omega(C_{gs1} + C_p)} + \left(\frac{C_{gs1}}{C_{gs1} + C_p}\right)^2 \omega_T L_1$$

Again referring to Table 1, it can be seen that in split mode (i.e., with both LNAs amplifying the input signal), FETs of both LNAs 202, 204 are on. The difference in the input impedance of the amplifier when operating in single mode versus the input impedance when operating in split mode is due to the gate-to-source capacitance $C_{gs}$ at the input transistor (e.g., FET) of each LNA 202, 204 being different when the LNA 202, 204 is on and when it is off. When the amplifier 200 is operating in split mode, the gates of the input FETs of each LNA 202, 204 present a capacitance value that is the sum of the parallel capacitances $C_{gs1\_on}$ and $C_{gs2\_on}$.

The relatively large changes in the $C_{gs}$ of the input FET 210, 214 of each LNA 202, 204 from the conducting state to the non-conducting state result in large changes in both the real and imaginary parts of the input impedance of the amplifier 200 when operating in single mode versus split mode. This problem is addressed in the presently disclosed method and apparatus by providing a source switch 235 that can be closed to couple the source of the first input FET 210 to the source of the second input FET 214. In single mode, when the second LNA 204 is turned off, coupling the sources of the two FETs 210, 214 together places the capacitance $C_{gs2\_off}$ of the second input FET 214 in parallel with the capacitance $C_{gs1\_on}$ of the first input FET 210.

The capacitance $C_{gs2\_off}$ is not as large as $C_{gs1\_on}$. Nonetheless, closing the switch 235 to combine the capacitances by connecting the sources of the two input FETs 210, 214 during single mode makes the input impedance presented in split mode (i.e., when both LNAs 202, 204 are turned on) much closer to the input impedance presented during single mode with the switch 235 open. However, this still represents a large impedance change as compared to split mode.

When operating in split mode, when both input FETs 214, 210 are conducting, the gate capacitance $C_{gs1\_on}$ is equal to $C_{gs2\_on}$. Accordingly, the capacitances of the two input FETs 210, 214 are placed in parallel with one another. As shown in Table 2, this creates a desired matched input for split mode. In split mode, the source switch 235 is opened. Opening the source switch 235 during split mode improves the noise isolation between the outputs 216, 218.

Figure 3:
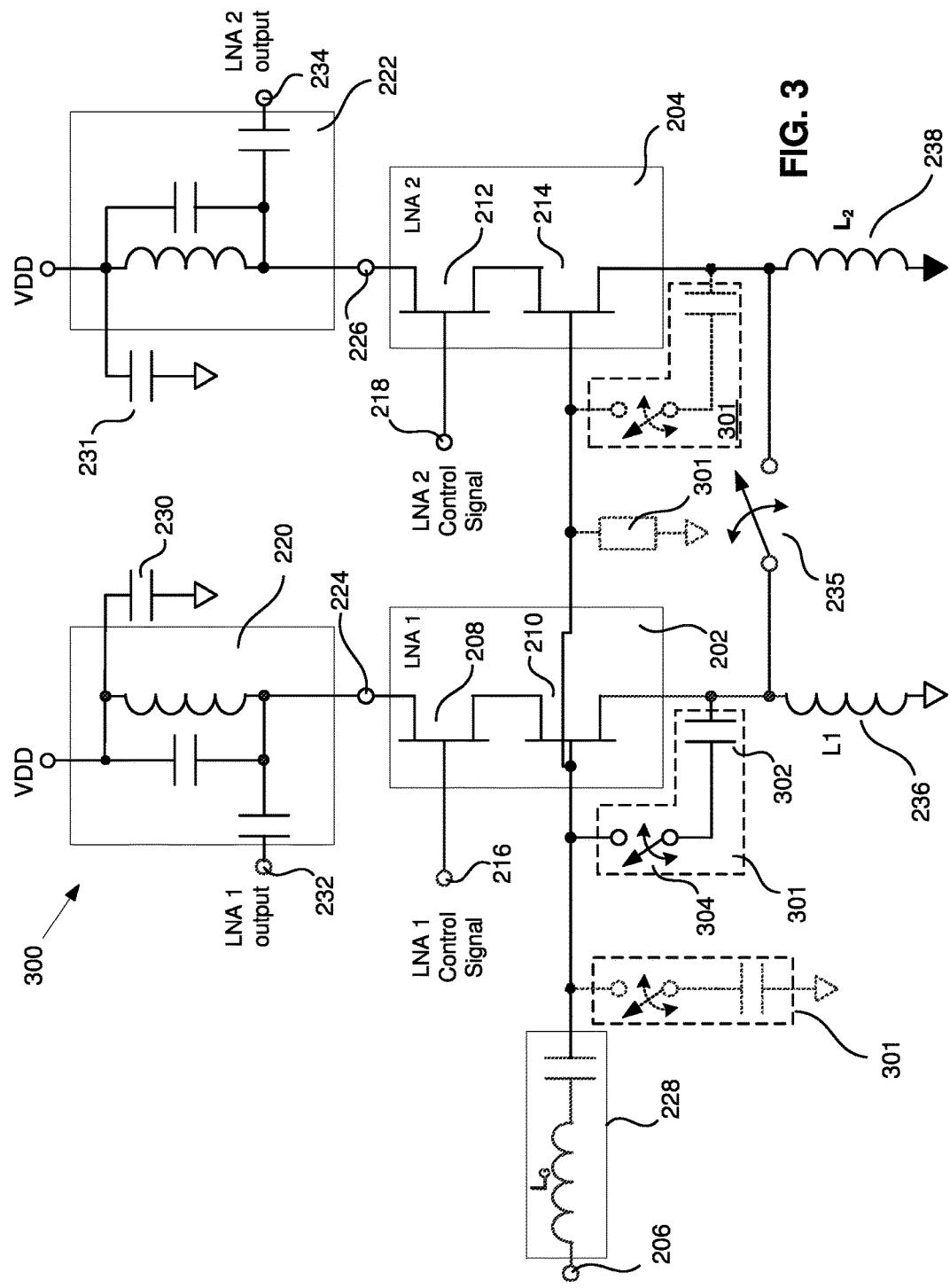
FIG. 3 is an illustration of a front end amplifier having a gate capacitor module and using multiple LNAs.

FIG. 3 is an illustration of another front end amplifier 300 that uses multiple LNAs. In addition to the source switch 235, the front end amplifier 300 has at least one gate capacitance module 301 comprising a gate capacitor 302 and a gate switch 304 connected in series between a first and second terminal of the module 301. The gate switch 304 can be switched to insert the gate capacitor 302 in parallel with the gate and source of the input FET 210 to provide additional input capacitance when the second LNA 204 is off. By adding the additional capacitance of the gate capacitor 302, the input impedance during single mode more closely matches the input impedance during split mode. Therefore, with both the gate switch 304 and the source switch 235 closed during single mode, the input impedance will very nearly match the input impedance present during split mode (during which both the switches 304, 235 are opened). In single mode, the gate switch 304 and the source switch 235 are closed. In split mode, the gate switch 304 and the source switch 235 are open.

In other embodiments, additional gate capacitance module 301 is placed between the gate and the source of the FET 214 or both FETs 210, 214. The primary advantage of the additional gate capacitance module 301 is that either LNA 202 or 204 can be operated in single mode and the LNA, 204 or 202 that is off can have its input impedance compensated. Since these LNAs may well be dedicated to certain channels, it is desirable to be able to use all possible combinations of them being either on or off.

When gate capacitors 302 are placed at the source of both FETs 210, 214, the total capacitance to be placed in the circuit can be distributed between the two gate capacitors 302. In addition, the gate capacitors 302 and the gate switches 304 within each gate capacitance module 301 can be placed in series between the gate and the source in either order. That is, the switch 304 can be coupled directly to the gate of the FET 210, 214 and the capacitor 302 coupled directly to the source of the FET 210, 214. Alternatively, the capacitor 302 can be coupled directly to the gate of the FET 210, 214 and the switch 304 coupled directly to the source of the FET 210, 214.

In other embodiments, an additional or alternative gate capacitance module 301 forming a selectable capacitance to ground can be placed between the gates of the FETs 210, 214 and ground. Additional gate capacitance modules 301 can also be placed at various points along the conductor that couples the gates of the FETs 210, 214 to provide distributed capacitance that can be selectively employed. Such additional gate capacitance modules 301 can be used in some embodiments and not in others, as indicated by the fact that the modules 301 are shown using dotted lines.

Figure 4:
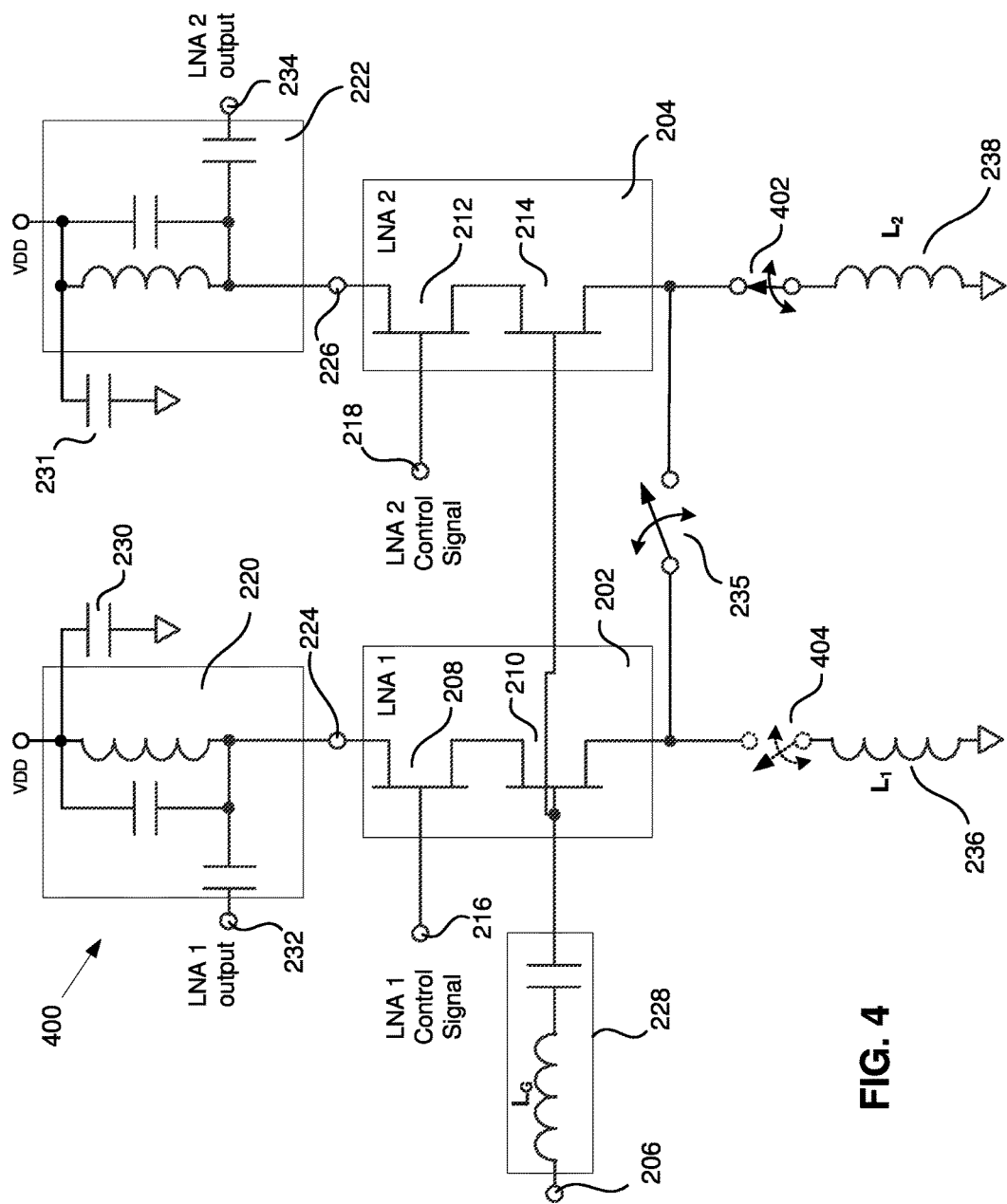
FIG. 4 is an illustration of a front end amplifier having a degeneration switch and using multiple LNAs operating in either single mode or split mode.

FIG. 4 is an illustration of yet another front end amplifier 400 that uses multiple LNAs. The front end amplifier 400 is essentially the same as the front end amplifier 200 shown in FIG. 2. However, the front end amplifier 400 has at least a first degeneration switch 402 to disconnect a degeneration component, such as a first degeneration inductor 238, from the second LNA 204 during single mode. In some embodiments, a second degeneration switch 404 is placed between the source of the first FET 210 and a second degeneration component, such as a second degeneration inductor 236, to allow the degeneration inductor 236 to be removed from the LNA 400. Accordingly, selection can be made as to which inductor 236, 238 to remove during single mode. The second degeneration switch 404 is shown using dotted lines to indicate that it is not in all embodiments. It will be clear to those of ordinary skill in the art that either of the two degeneration switches 402, 404 can be provided alone or the two switches 402, 404 may both be provided together. That is, the fact that the degeneration switch 404 is shown using dotted lines rather than also showing the degeneration switch 402 using dotted lines is merely for the sake of expedience and is not intended to indicate that one of the switches 402, 404 is preferred over the other.

Disconnecting a degeneration inductor 236, 238 when the source switch 235 is closed provides operating conditions for the active LNA 210, 214 that more closely matches the operating conditions provided to each LNA 210, 214 during split mode when the source switch 235 is open. That is, when the source switch 235 is open during split mode, each LNA 202, 204 sees only the inductance of the one degeneration inductor 236, 238 that is coupled to the respective source of the input FET 210, 214 associated with that LNA 202, 204. Without opening either of the degeneration switches 402, 404 during single mode, the short through the source switch 235 will put the two degeneration inductors 236, 238 in parallel, reducing their total effective inductance. Therefore, the inductance at the source of the active LNA 202, 204 would be twice what is present in split mode. However, by opening one of the degeneration switches 402, 404 in single mode, the active LNA 202, 214 operating in single mode has an inductive load between the source and ground that is equal to the inductance of just one of the degeneration inductors 236, 238, thus more closely matching the inductance presented during split mode. Providing a second degeneration switch 404 provides flexibility as to which inductance to present at the source of the active input FET 210, 214 no matter which LNA 202, 204 is turned on during single mode.

Figure 5:
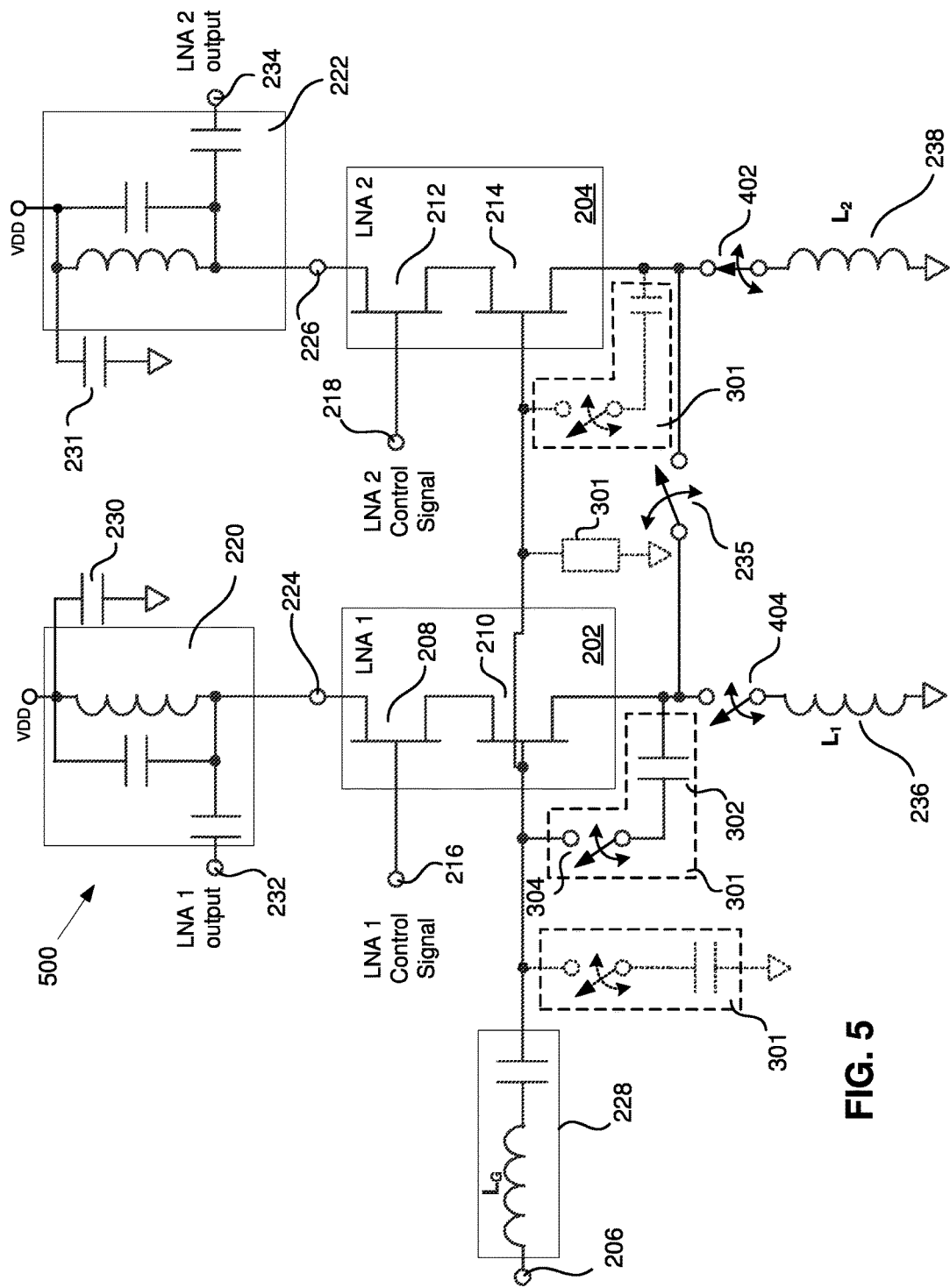
FIG. 5 illustrates a front end amplifier having degeneration switches, gate capacitor modules and using multiple LNAs operating in either single mode or split mode.

FIG. 5 illustrates yet one more embodiment of a front end amplifier 500 using multiple LNAs capable of operating in either single mode or split mode. In the front end amplifier 500, at least one of the degeneration switches 402, 404 are provided. In addition, one embodiment of the front end amplifier 500 has a gate capacitance module 301 comprising a gate capacitor 302 and gate switch 304, similar to that shown in FIG. 3. Alternatively, or in addition, the front end amplifier 500 has at least one gate capacitance module 301 coupled between the gate of the input FETs 210, 214 and ground. As is the case of the front end amplifier 300 shown in FIG. 3, the gate capacitance modules 301 are shown in dotted line to indicate that they are optional or alternatives to the gate capacitance module 301 comprising the capacitor 302 and associated switch 304. Additionally, as noted above with respect to the front end amplifier 300, the order of the series capacitor and switches within the gate capacitance modules 301 will not affect the operation. Therefore, each capacitor and associated switch may be coupled in series without regard for whether the switch or the capacitor is coupled to the gate of the FETs 210, 214.

It should be noted that for the sake of simplifying the figures, the LNA Controller 217 of FIG. 2 is not explicitly shown in FIGS. 3-5. However, those skilled in the art will understand that an LNA Controller similar to 217 shown in FIG. 2 can be used to generate the LNA control signals for each of the LNAs, as well as to control the opening and closing of the various switches 235, 304, 402, 404 discussed throughout the above disclosure.

In accordance with one embodiment of the disclosed method and apparatus, the switches 235, 304, 402, 404 can be manufactured in accordance with techniques provided in U.S. Pat. No. 6,804,502 (the "502 patent"), which is incorporated by reference herein, and disclosed in other related patents. Additional improvements in the performance of one or more of the switches 235, 304, 402, 404 can be attained by implementing the techniques provided in U.S. Pat. No. 7,910,993 (the "993 patent"), which is incorporated by reference herein, and disclosed in other related patents. Use of such high performance switches reduces the non-linearity of the switches and thus the adverse effects of such switches on the performance of the receiver. However, in many implementations, it may be possible to use switches that have performance characteristics (i.e., linearity, return loss, switching speed, ease of integration, etc.) that are not as good as the characteristics of switches made in accordance with the techniques disclosed in the '502 and '993 patents. Accordingly, each or some of the switches disclosed above can be implemented using any combination of one or more transistors, including FETs, bipolar junction transistors (BJTs), or any other semiconductor switch. Alternatively, the switches can be implemented by electromechanical or MEMs (Micro-Electro-Mechanical Systems) technologies.

Methods

Figure 6:
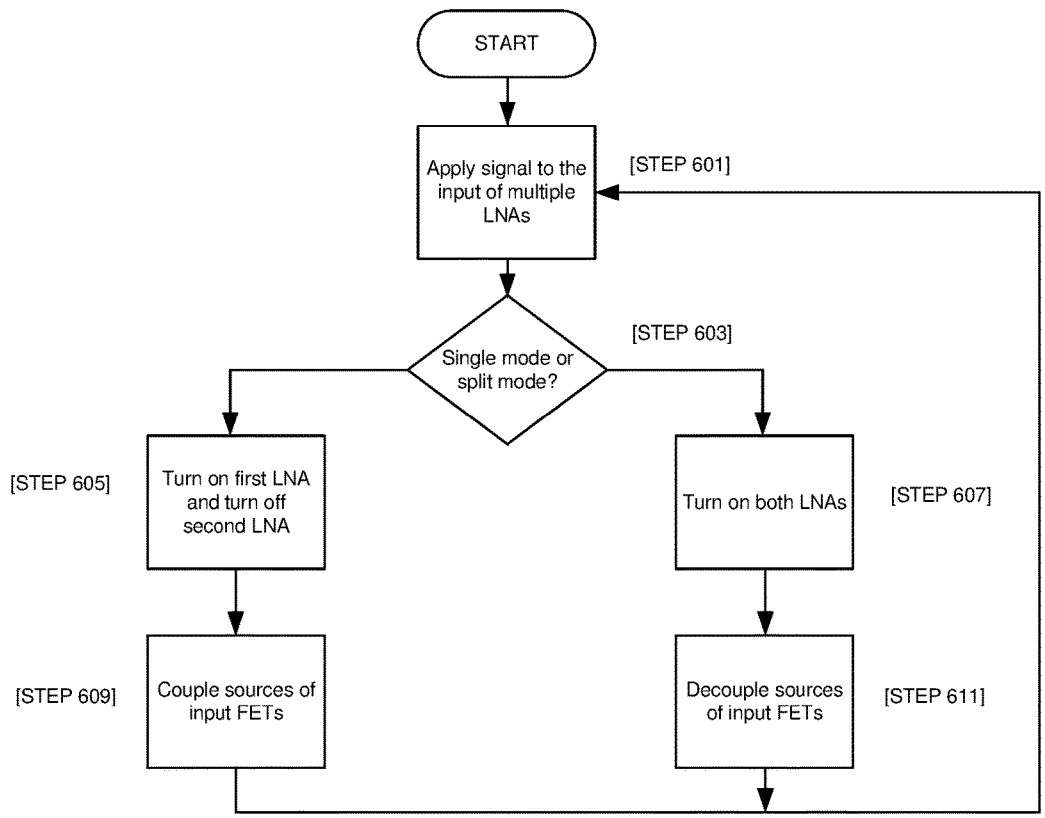
FIG. 6 illustrates a method in accordance with one embodiment for amplifying a signal (e.g., a CA signal) using more than one amplifier.

FIG. 6 is an illustration of a method in accordance with one embodiment for amplifying a signal (e.g., a CA signal) using more than one amplifier. The signal is applied to the input of the amplifiers [STEP 601]. In some embodiments, the signal includes a first and a second non-adjacent channel. The first and second channels are considered to be non-adjacent if there is at least a narrow frequency range between the defined end of the frequency range of the first channel and the defined beginning of the frequency range of the second channel. Typically, at least a third channel is defined within the frequency range between the end of the first and beginning of the second channel. The frequency range of a channel is typically defined by industry standards, but in some cases may be defined by the 3 dB frequency range of filters commonly used to receive signals transmitted over the channel.

The method further includes selecting between a single mode or a split mode [STEP 603]. In one embodiment, the selection between single mode and split mode is made by turning on a first LNA 202 and turning off a second LNA 204 to select single mode [STEP 605]. In one such embodiment, the first LNA 202 is turned on by applying an LNA control signal to a first control input terminal 216 coupled to the gate of an output FET, such as the FET 208 shown in FIGS. 2-5. The second LNA 204 is turned off by applying an LNA control signal to a second control input terminal 218. Similarly, the selection of split mode is made by applying LNA control signals to the control terminals 216, 218 to turn both LNAs 202, 204 on [STEP 607].

The method further includes coupling the source of an input FET of the first LNA 202, such as FET 210 and the source of an input FET of the second LNA 204, such as the FET 212, during single mode [STEP 609] and decoupling the two sources during split mode [STEP 611]. In one such embodiment, a source switch 235 is closed in single mode and opened in split mode. When closed, the source switch 235 couples the two sources of the input FETs 210, 212.

Figure 7:
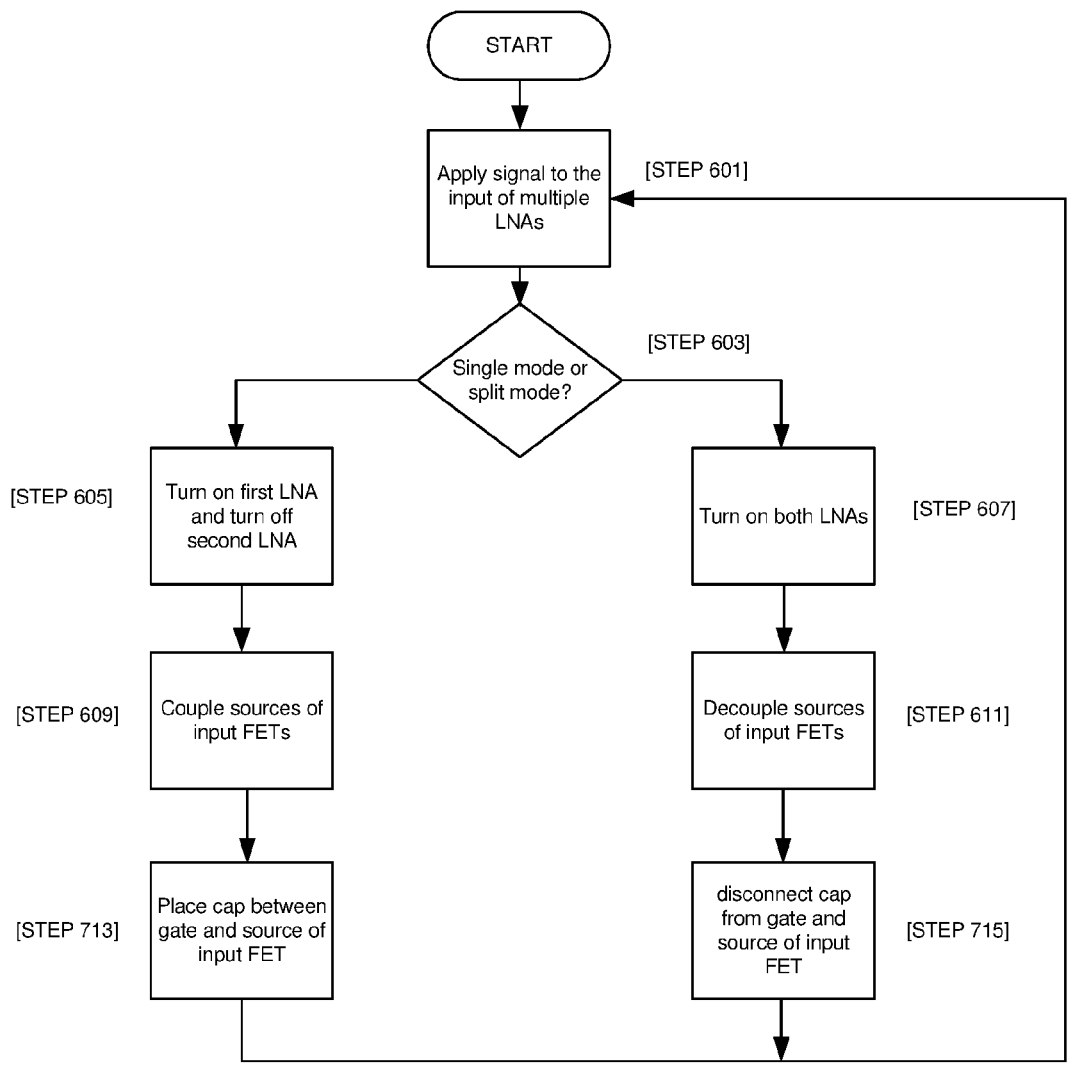
FIG. 7 is an illustration of a method in accordance with one embodiment for amplifying a signal (e.g., a CA signal) using more than one amplifier.

Another embodiment illustrated in FIG. 7 further includes placing a capacitor, such as the gate capacitor 302, between the gate and the source of the input FETs 210, 212 during single mode [STEP 713]. In one embodiment, the capacitor is so placed by closing a gate switch 304. The capacitor is disconnected by opening the gate switch 304 during split mode [STEP 715]. One such embodiment further includes selecting the capacitance value of the gate capacitor such that the input impedance seen looking into the amplifier is essentially the same during single mode and during split mode. Stated another way, the capacitance of the gate capacitor is selected such that the capacitive load placed on the signal source coupled to the amplifier input is the same in single mode with the gate switch closed and in split mode with the gate switch open.

Figure 8:
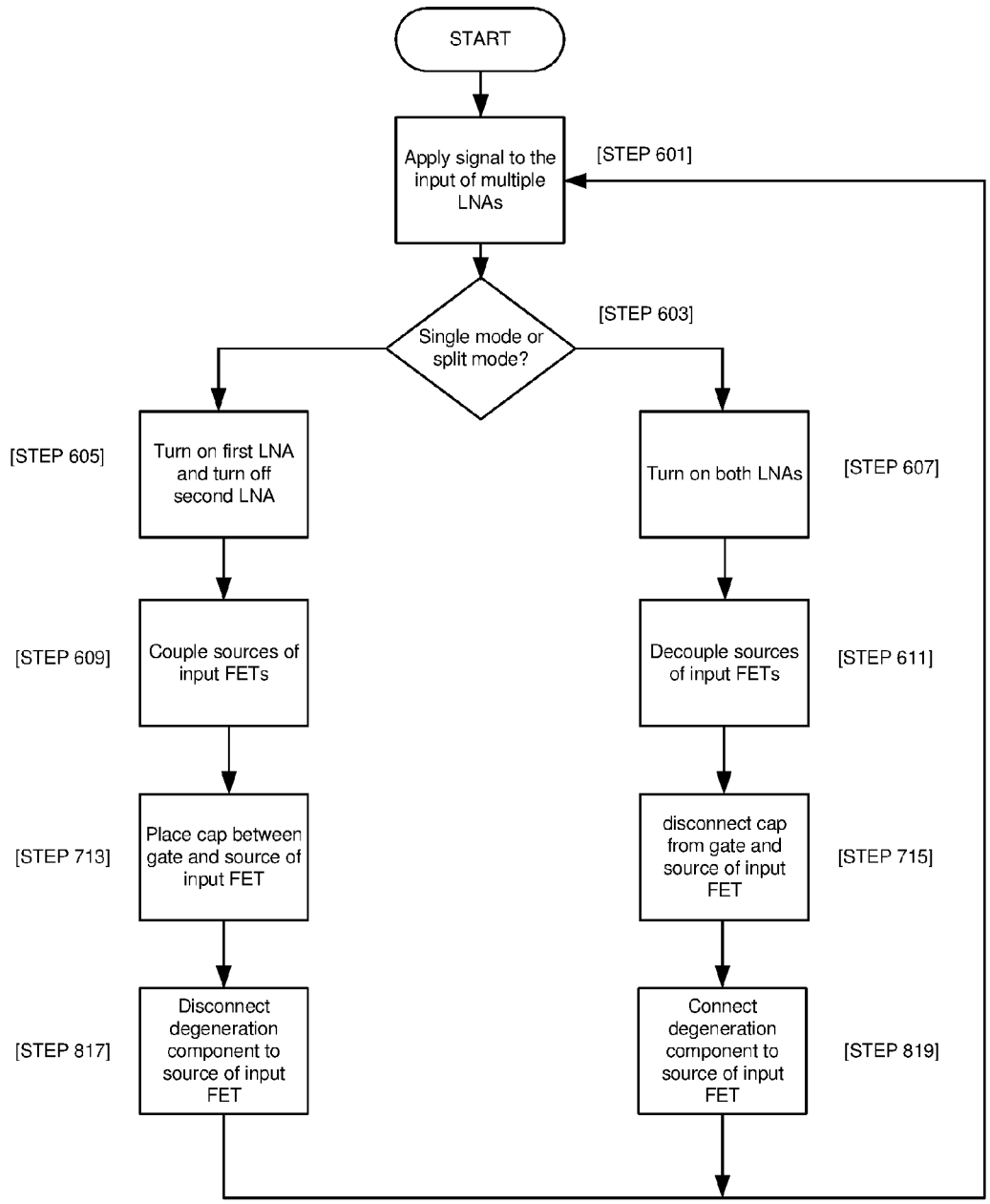
FIG. 8 is an illustration of a method in accordance with one embodiment for amplifying a signal (e.g., a CA signal) using more than one amplifier.

In yet another embodiment shown in FIG. 8, the method includes opening a degeneration switch 402, 404 during single mode to disconnect the source of an input FET 210, 214 of an inactive LNA 202, 214 from degeneration component, such as an inductor 236, 238 or other reactive circuit [STEP 817]. The method may further includes closing a first degeneration switch 402 and opening a second degeneration switch 404 in a first single mode and opening the first degeneration switch 402 and closing the second degeneration switch 404 in a second single mode. In one embodiment, such a method further includes turning on the first LNA 202 and turning off the second LNA 204 in the first single mode. The method may further include turning on the second LNA 204 and turning off the first LNA 202 in the second single mode. In split mode, the degeneration components 236, 238 are connected to the source of the input FETs 210, 214 [STEP 819].

Figure 9:
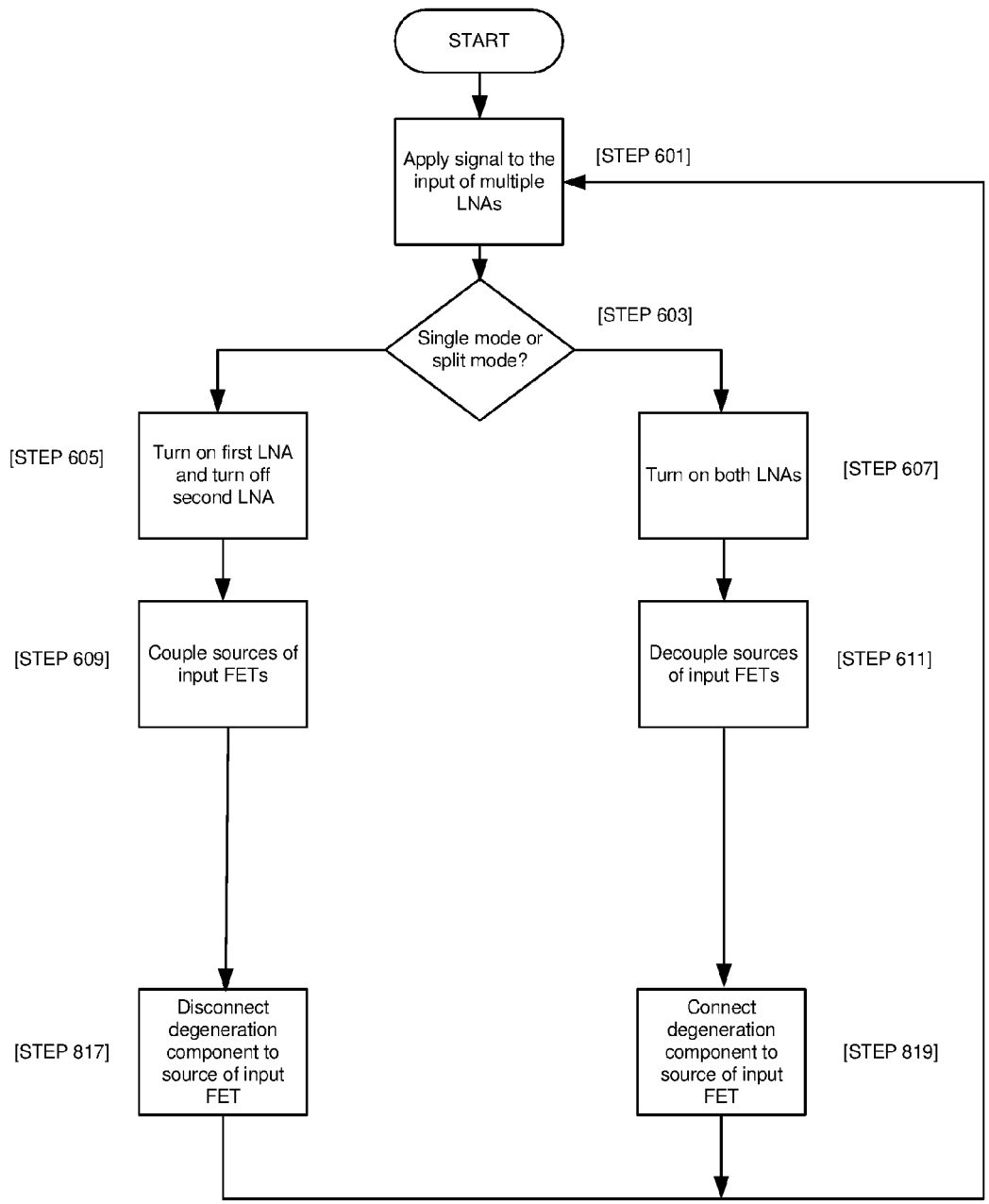
FIG. 9 illustrates a modification to the method of FIG. 8 in which STEPS 713 and 715 are removed.

As shown in FIG. 9, in some embodiments the method illustrated in FIG. 8 can be modified to remove STEPS 713 and 715. Nonetheless, the sources of the input FETs 210, 214 are coupled during single mode and the degeneration components are disconnected from the source of one of the input FETs 210, 214. In split mode, the sources of the input FETs 210, 214 are disconnected and the degeneration components 236, 238 are connected to the source of the respective input FETs 210, 214.

Fabrication Technologies and Options

As should be readily apparent to one of ordinary skill in the art, various embodiments of the claimed invention can be implemented to meet a wide variety of specifications. Unless otherwise noted above, selection of suitable component values is a matter of design choice and various embodiments of the claimed invention may be implemented in any suitable IC technology (including but not limited to MOSFET and IGFET structures), or in hybrid or discrete circuit forms. Integrated circuit embodiments may be fabricated using any suitable substrates and processes, including but not limited to standard bulk silicon, silicon-on-insulator (SOI), silicon-on-sapphire (SOS), GaN HEMT, GaAs pHEMT, and MESFET technologies. However, in some cases, the inventive concepts claimed may be particularly useful with an SOI-based fabrication process (including SOS), and with fabrication processes having similar characteristics.

A number of embodiments of the claimed invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion. It is to be understood that the foregoing description is intended to illustrate and not to limit the scope of the claimed invention, which is defined by the scope of the following claims, and that other embodiments are within the scope of the claims.

What is claimed is:

1. An amplifier including:
   (a) plurality of low noise amplifiers (LNA), each including; an input transistor and an output transistor;
   (b) at least two control input terminals, each coupled to an output transistor of a corresponding one of the LNAs;
   (c) at least one source switch connecting source terminals of the input transistors of at least two of the LNAs during a first mode of operation and disconnecting the source terminals during at least a second mode of operation; and
   (d) a gate capacitance module, the gate capacitance module having a first and second terminal, the first terminal coupled to the gate of an associated one of the input transistors and the second terminal coupled to the source of the associated input transistor.

2. The amplifier of claim 1, wherein signals coupled to the control input terminals turn the corresponding LNA on and off.

3. The amplifier of claim 1, further including at least a second gate capacitance module, each additional gate capacitance module having a first and second terminal, the first terminal coupled to the gate of an associated one of the input transistors and the second terminal coupled to the source of the associated input transistor.

4. The amplifier of claim 1, further including a control module having at least one switch control signal output, wherein each gate capacitance module has a switch control signal input to which a corresponding switch control signal output is coupled.

5. The amplifier of claim 1, wherein each gate capacitance module includes a gate capacitor and a gate switch coupled in series between the first terminal and the second terminal of the gate capacitance module.

6. The amplifier of claim 5, wherein the gate switch is open when the associated transistor is conducting and closed when the associated transistor is not conducting.

7. An amplifier including:
(a) plurality of low noise amplifiers (LNA), each including; an input transistor and an output transistor;
(b) at least two control input terminals, each coupled to an output transistor of a corresponding one of the LNAs;
(c) at least one source switch connecting source terminals of the input transistors of at least two of the LNAs during a first mode of operation and disconnecting the source terminals during at least a second mode of operation; and
(d) at least one gate capacitance module, each gate capacitance module having a first and second terminal, the first terminal coupled to the gate of an associated one of the input transistors and the second terminal coupled to ground.

8. The amplifier of claim 7, further including a control module having at least one switch control signal output, wherein each gate capacitance module has a switch control signal input to which a corresponding switch control signal output is coupled.

9. The amplifier of claim 7, wherein each gate capacitance module includes a gate capacitor and a gate switch coupled in series between the first terminal and the second terminal of the gate capacitance module.

10. The amplifier of claim 9, wherein the gate switch is open when the associated input transistor is on and closed when the associated input transistor is off.

11. A plurality of low noise amplifiers (LNA), each including:
(a) an input transistor and an output transistor;
(b) at least two control input terminals, each coupled to an output transistor of a corresponding one of the LNAs; and
(c) at least one source switch connecting source terminals of the input transistors of at least two of the LNAs during a first mode of operation and disconnecting the source terminals during at least a second mode of operation;
(d) a degeneration component; and
(e) a degeneration switch coupled in series with the degeneration component, the series combination of the degeneration component and degeneration switch coupled between the source of one of the input transistors and circuit ground,
wherein the degeneration switch is open when the source switch is closed and closed when the source switch is open.

12. The amplifier of claim 11, wherein the degeneration component is a degeneration inductor.

13. The amplifier of claim 11, further including at least a second degeneration component and a second degeneration switch, the second degeneration component and second degeneration switch coupled in series between the source of a second input transistor and ground, and the second degeneration switch being closed when the first degeneration switch is open.

14. The amplifier of claim 11, further including a control module having a switch control signal output, wherein the degeneration switch has a switch control signal input to which the switch control signal output is coupled.

15. The amplifier of claim 1, further including:
(a) a degeneration component;
(b) a degeneration switch coupled in series with the degeneration component, the series combination of the degeneration component and degeneration switch coupled between the source of one of the input transistors ground.

16. The amplifier of claim 15, wherein the degeneration component is an inductor.

17. The amplifier of claim 15,
wherein each gate capacitance module includes a gate capacitor and a gate switch coupled in series between the first terminal and the second terminal of the gate capacitance module,
wherein the degeneration switch is open when the source switch is closed and closed when the source switch is open and
wherein the gate switch is closed when the source switch is closed and open when the source switch is open.

18. The amplifier of claim 15, further including at least a second degeneration inductor and a second degeneration switch,
wherein each gate capacitance module includes a gate capacitor and a gate switch coupled in series between the first terminal and the second terminal of the gate capacitance module,
wherein the degeneration switch is open when the source switch is closed and closed when the source switch is open,
wherein the gate switch is closed when the source switch is closed and open when the source switch is open and
wherein the second degeneration inductor and second degeneration switch are coupled in series between the source of a second input transistor and ground, and the second degeneration switch being closed when the first degeneration switch is open.

19. The amplifier of claim 15, further including a control module having switch control signal outputs, wherein the degeneration switch has a switch control signal input to which one of the switch control signal outputs is coupled and each gate capacitance module has a switch control signal input to which one of the switch control signal outputs is coupled.

20. A method for amplifying a signal in more than one amplifier including:
(a) coupling the signal to be amplified to the input of at least a first and second LNA, each LNA having an input transistor having a first terminal to which the input signal is applied, a second terminal and a third terminal;
(b) turning on the first and second LNAs during a first mode;
(c) opening a switch between the second terminal of the first transistor and the second terminal of the second transistor during the first mode;
(d) turning off one of the first and second transistors during a second mode; and
(e) closing the switch between the first and second transistor in the second mode.

21. The method of claim 20, further including closing a gate switch to place a capacitance between the first terminal of the first transistor and the second terminal of the first transistor during the second mode when the LNA having the first transistor is off.

22. The method of claim 21, further including opening the switch to remove the capacitor from between the first terminal of the first transistor and the second terminal of the first transistor during the first mode.

23. The method of claim 22, wherein the capacitance of the capacitor is selected such that the input impedance seen looking into the LNA is essentially the same during the first mode as during the second mode.

24. The method of claim 22, wherein the first and second transistor are field effect transistors and the first terminal is the gate, the second terminal is the source and the third terminal is the drain.

25. The method of claim 20, further including closing a gate switch to place a capacitor between the first terminal of the first transistor and ground during the second mode if the LNA having the first transistor is off.

26. The method of claim 25, further including opening a switch to disconnect a capacitor from between the first terminal of the first transistor and ground during the first mode.

27. The method of claim 26, wherein the capacitance of the capacitor is selected such that an input impedance seen looking into the LNA is essentially the same during the first mode as during the second mode.

28. The method of claim 26, wherein the first and second transistor are field effect transistors and the first terminal is the gate, the second terminal is the source and the third terminal is the drain.

29. The method of claim 22, further including opening a first degeneration switch to disconnect the second terminal of one of the first and second transistors from ground when changing from the first mode to the second mode.

30. The method of claim 29, further including closing a gate switch to place a capacitor between the first terminal of the first transistor and the second terminal of the first transistor during the second mode.

31. The method of claim 29, further including opening a switch to disconnect a capacitor from between the first terminal of the first transistor and the second terminal of the first transistor during the first mode.

32. The method of claim 29, further including closing a gate switch to place a capacitor between the first terminal and the ground during the second mode.

33. The method of claim 29, further including opening a switch to disconnect a capacitor from between the first terminal of the first transistor and ground during the first mode.

* * * * *